(12) United States Patent
Pfeuffer

(10) Patent No.: US 10,629,777 B2
(45) Date of Patent: Apr. 21, 2020

(54) OPTOELECTRONIC SEMICONDUCTOR CHIP

(71) Applicant: OSRAM OLED GmbH, Regensburg (DE)

(72) Inventor: Alexander F. Pfeuffer, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/092,480

(22) PCT Filed: Apr. 13, 2017

(86) PCT No.: PCT/EP2017/059022
§ 371 (c)(1),
(2) Date: Oct. 10, 2018

(87) PCT Pub. No.: WO2017/178627
PCT Pub. Date: Oct. 19, 2017

(65) Prior Publication Data
US 2019/0165215 A1    May 30, 2019

(30) Foreign Application Priority Data

Apr. 13, 2016 (DE) .................. 10 2016 106 831

(51) Int. Cl.
*H01L 33/40* (2010.01)
*H01L 33/38* (2010.01)
(Continued)

(52) U.S. Cl.
CPC ............ *H01L 33/405* (2013.01); *H01L 33/06* (2013.01); *H01L 33/22* (2013.01); *H01L 33/32* (2013.01);
(Continued)

(58) Field of Classification Search
None
See application file for complete search history.

(56) References Cited

U.S. PATENT DOCUMENTS 8,928,052 B2 * 1/2015 Engl .................. H01L 33/382
257/200
2005/0211989 A1   9/2005 Horio et al.
(Continued)

FOREIGN PATENT DOCUMENTS

DE   10 2008 024 327 A1   11/2009
DE   10 2008 051 050 A1   4/2010
(Continued)

OTHER PUBLICATIONS

Notice of Reasons for Rejection dated Aug. 20, 2019, of counterpart Japanese Application No. 2018-551980, along with an English translation.

*Primary Examiner* — Lex H Malsawma
(74) *Attorney, Agent, or Firm* — DLA Piper LLP (US)

(57) ABSTRACT

An optoelectronic semiconductor chip includes a semiconductor body including an n-conducting region, a p-conducting region and an active region between the n-conducting region and the p-conducting region; a first mirror containing a first metallic layer, and a p-metallization containing a second metallic layer, wherein during operation of the semiconductor chip, the first mirror is not at the same electrical potential as the p-conducting region, during operation of the semiconductor chip, the p-metallization is at the same electrical potential as the p-conducting region, and the first mirror has at least one opening through which the p-metallization is electrically conductively connected to the p-conducting region.

20 Claims, 5 Drawing Sheets

(51) Int. Cl.
    *H01L 33/46*    (2010.01)
    *H01L 33/06*    (2010.01)
    *H01L 33/22*    (2010.01)
    *H01L 33/32*    (2010.01)
    *H01L 33/44*    (2010.01)
    *H01L 33/00*    (2010.01)
    *H01L 33/42*    (2010.01)

(52) U.S. Cl.
    CPC ............ *H01L 33/382* (2013.01); *H01L 33/44* (2013.01); *H01L 33/46* (2013.01); *H01L 33/0095* (2013.01); *H01L 33/42* (2013.01); *H01L 2933/0016* (2013.01); *H01L 2933/0025* (2013.01)

(56) References Cited

U.S. PATENT DOCUMENTS

| | | |
|---|---|---|
| 2009/0039374 A1 | 2/2009 | Yahata et al. |
| 2009/0146165 A1 | 6/2009 | Hasnain et al. |
| 2010/0171135 A1* | 7/2010 | Engl .................... H01L 33/382 257/98 |
| 2011/0049555 A1* | 3/2011 | Engl .................... H01L 33/382 257/98 |
| 2011/0079810 A1 | 4/2011 | Albrecht et al. |
| 2012/0241720 A1 | 9/2012 | Totani et al. |
| 2012/0244653 A1 | 9/2012 | Totani et al. |
| 2013/0015483 A1 | 1/2013 | Shimokawa et al. |
| 2013/0049053 A1 | 2/2013 | Kususe et al. |
| 2014/0054635 A1 | 2/2014 | Herrmann et al. |
| 2014/0061703 A1 | 3/2014 | Von Malm |
| 2014/0117399 A1 | 5/2014 | Choi et al. |
| 2014/0159063 A1 | 6/2014 | Odnoblyudov et al. |
| 2014/0197372 A1 | 7/2014 | Jeong |
| 2014/0252382 A1 | 9/2014 | Hashimoto et al. |
| 2014/0374784 A1 | 12/2014 | Kim |
| 2015/0236206 A1* | 8/2015 | Gaertner .................... H01L 33/38 257/98 |
| 2016/0027980 A1 | 1/2016 | Hahn et al. |
| 2017/0062351 A1 | 3/2017 | Von Malm et al. |
| 2017/0200861 A1 | 7/2017 | Pfeuffer et al. |
| 2018/0151548 A1 | 5/2018 | Pfeuffer et al. |
| 2018/0166499 A1 | 6/2018 | Pfeuffer et al. |

FOREIGN PATENT DOCUMENTS

| | | |
|---|---|---|
| DE | 10 2011 012 924 A1 | 9/2012 |
| DE | 10 2011 015 821 A1 | 10/2012 |
| DE | 10 2013 103 409 A1 | 10/2014 |
| DE | 10 2014 102 029 A1 | 8/2015 |
| DE | 10 2015 108 532 A1 | 12/2016 |
| DE | 10 2015 108 545 A1 | 12/2016 |
| EP | 2 757 598 A2 | 7/2014 |
| EP | 2 765 618 A2 | 8/2014 |
| EP | 2 423 984 B1 | 5/2016 |
| JP | H11-150298 | 6/1999 |
| JP | H11-340514 A | 12/1999 |
| JP | 2005-302747 A | 10/2005 |
| JP | 2007-287849 A | 11/2007 |
| JP | 2009-43934 A | 2/2009 |
| JP | 2009-164423 A | 7/2009 |
| JP | 2009-295611 A | 12/2009 |
| JP | 2012-69909 A | 4/2012 |
| JP | 2012-212848 A | 11/2012 |
| JP | 2012-212849 A | 11/2012 |
| JP | 2013-21175 A | 1/2013 |
| JP | 2013-65773 A | 4/2013 |
| JP | 2014-44971 A | 3/2014 |
| JP | 2014-67894 A | 4/2014 |
| JP | 2014-135490 A | 7/2014 |
| JP | 2014-175427 A | 9/2014 |
| JP | 2014-527313 A | 10/2014 |
| JP | 2015-119063 A | 6/2015 |
| JP | 2016-503232 A | 2/2016 |
| WO | 2015/189406 A1 | 12/2015 |

\* cited by examiner

OPTOELECTRONIC SEMICONDUCTOR CHIP

TECHNICAL FIELD

This disclosure relates to an optoelectronic semiconductor chip.

BACKGROUND

There is a need to provide an optoelectronic semiconductor chip having improved aging behavior and/or improved efficiency.

SUMMARY

I provide an optoelectronic semiconductor chip including a semiconductor body including an n-conducting region, a p-conducting region and an active region between the n-conducting region and the p-conducting region; a first mirror containing a first metallic layer, and a p-metallization containing a second metallic layer, wherein during operation of the semiconductor chip, the first mirror is not at the same electrical potential as the p-conducting region, during operation of the semiconductor chip, the p-metallization is at the same electrical potential as the p-conducting region, and the first mirror has at least one opening through which the p-metallization is electrically conductively connected to the p-conducting region.

I also provide an optoelectronic semiconductor chip including a semiconductor body including an n-conducting region, a p-conducting region and an active region between the n-conducting region and the p-conducting region; a first mirror containing a first metallic layer, and a p-metallization containing a second metallic layer, wherein during operation of the semiconductor chip, the first mirror is not at the same electrical potential as the p-conducting region, during operation of the semiconductor chip, the p-metallization is at the same electrical potential as the p-conducting region, the first mirror has at least one opening through which the p-metallization is electrically conductively connected to the p-conducting region, and the active region is completely surrounded by the first mirror in lateral directions.

LIST OF REFERENCE NUMBERS

Figure 1A:
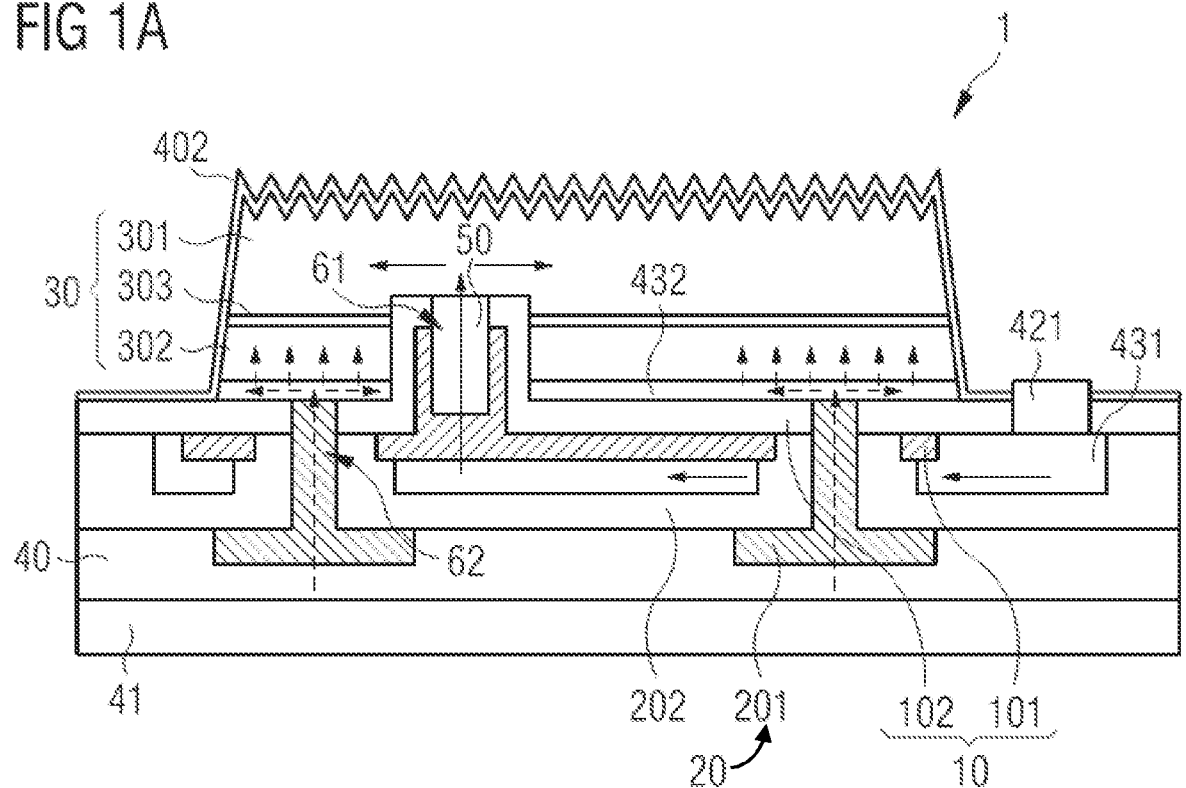
FIGS. 1A, 1B, 1C, 2, 3, 4, 5A, 5B and 6 show, in schematic sectional illustrations, examples of an optoelectronic semiconductor chip.

1 Semiconductor Chip
10 first mirror
101 first metallic layer
102 first dielectric
20 p-metallization
201 second metallic layer
202 second dielectric
30 Semiconductor body
301 n-conducting region
302 p-conducting region
303 active region
40 solder region
41 carrier
402 third dielectric
421 first contact structure
422 second contact structure
431 first current spreading layer
432 second current spreading layer
61 first via
62 second via
63 third via
62 fourth via
65 recess

DETAILED DESCRIPTION

The optoelectronic semiconductor chip is, for example, a radiation-emitting optoelectronic semiconductor chip. For example, the semiconductor chip may be a light-emitting diode chip or a laser chip. The optoelectronic semiconductor chip can generate light during operation. In particular, it is possible for the optoelectronic semiconductor chip to generate light in the spectral range from UV radiation to light in the infrared range, in particular visible light. Alternatively, it is possible for the optoelectronic semiconductor chip to be a radiation-detecting semiconductor chip, for example, a photodiode.

The optoelectronic semiconductor chip may comprise a semiconductor body having an n-conducting region, a p-conducting region and an active region between the n-conducting region and the p-conducting region. The semiconductor body has a main extension plane perpendicular to the stacking direction of the n-type, p-type, and active regions. In this case, the semiconductor body may, for example, be based on a nitride compound semiconductor material, for example, AlGaInN or a phosphide compound semiconductor material, for example, InGaAlP.

"Nitride compound semiconductor material" means that the semiconductor body or at least a portion thereof, more preferably at least the active region, comprises or consists of a nitride compound semiconductor material, preferably $Al_nGa_mIn_{1-n-m}N$, wherein $0 \leq n \leq 1$, $0 \leq m \leq 1$ and $n+m \leq 1$. This material does not necessarily have to have a mathematically exact composition according to the above formula. Rather, it may, for example, have one or more dopants and additional constituents. For the sake of simplicity, however, the above formula contains only the essential constituents of the crystal lattice, i.e. Al, Ga, In, N, even if these can be partially replaced and/or supplemented by small amounts of further substances.

The n-conducting region of the semiconductor body is doped with at least one n-dopant, for example, silicon. In the p-conducting region, the semiconductor body is doped with at least one p-type dopant, for example, magnesium.

The active region is arranged between the p-conducting region and the n-conducting region. The active region may be formed, for example, as a multiple quantum well structure. In the operation of the optoelectronic semiconductor chip, for example, electromagnetic radiation is generated in the active region. The electromagnetic radiation is generated by recombination of charge carriers, which takes place in the multiple quantum well structure. Alternatively, in the active region, the detection of electromagnetic radiation can take place by the generation of charge carrier pairs.

The optoelectronic semiconductor chip may have a first mirror containing a first metallic layer. The first mirror may comprise a further electrically conductive metallic layer that may be formed from a metal or a metal compound or as a metal stack. The first mirror has, for example, a main extension plane extending perpendicular to the growth direction of the semiconductor body.

The first mirror has a high reflectivity for electromagnetic radiation generated during operation of the optoelectronic semiconductor chip. For example, the reflectivity of the first mirror at a wavelength of 450 nm and/or 550 nm is at least 75%, in particular at least 85%, for example, at least 90%.

The optoelectronic semiconductor chip may comprise a p-metallization. The p-metallization can have a high reflectivity for electromagnetic radiation generated during operation of the optoelectronic semiconductor chip. For example, the reflectivity of the p-metallization at a wavelength of 450 nm is at least 50%, in particular at least 65%, for example, at least 80%. In particular, the p-metallization can form a second mirror. By way of example, the p-metallization may reflect at least part of the electromagnetic radiation generated during operation of the optoelectronic semiconductor chip.

The p-metallization may comprise an electrically conductive second metallic layer that may be formed of a metal or a metal compound or a metal stack.

During operation of the semiconductor chip, the first mirror may not be at the same electrical potential as the p-conducting region. In operation of the semiconductor chip, the p-conducting region is set to a potential different from the n-conducting region. For example, during operation, the first mirror has a smaller potential difference to the n-conducting region than the p-conducting region. In particular, the electrically conductive region of the first mirror, for example, the first metallic layer of the first mirror, and the n-conductive region can be at the same electrical potential. In this context, "at the same electrical potential" means that potential differences can only be attributed to the contact resistance between the first mirror and the n-conducting region. The first mirror can therefore electrically conductively connect to the n-conducting region of the semiconductor body. That is, the electrically conductive regions of the first mirror then electrically conductively connect to the semiconductor body.

In operation of the semiconductor chip, the p-metallization may have the same electrical potential as the p-conducting region. That is, the electrically conductive regions, for example, the second metallic layer of the p-metallization electrically conductively connect to the p-conducting region of the semiconductor body. In particular, the p-conducting region is contacted via the p-metallization in an electrically conductive manner. In this context, "at the same electrical potential" means that potential differences can only be attributed to the contact resistance between the p-metallization and the p-conducting region.

The first mirror may have at least one opening through which the p-metallization connects in an electrically conductive manner to the p-conducting region. In this case, the opening in the first mirror may be a recess that completely penetrates the mirror, for example, transversely or perpendicular to its main extension plane. In the opening of the first mirror, a part of the p-metallization is arranged. This part of the p-metallization can directly electrically and mechanically connect to the p-conducting region. Alternatively, this part of the p-metallization may electrically conductively connect to the p-conducting region by further electrically conductive structures, in particular a current spreading layer.

The p-metallization can have regions in which the p-metallization runs essentially parallel to the main extension plane of the first mirror. In addition, the p-metallization may have further areas in which the second mirror is perpendicular or transverse to the main extension plane of the first mirror. In these further areas, electrically conductive material of the p-metallization passes through the opening of the first mirror and connects in this area in an electrically conductive manner to the p-conducting region of the semiconductor body.

In particular, the contact region between the p-conducting region and the p-metallization is designed to be reflective. Electrically conductive parts of the p-metallization are not in direct physical contact with electrically conductive parts of the first mirror. Electrically conductive parts of the first mirror and electrically conductive parts of the p-metallization are separated from each other, for example, by a first dielectric of the first mirror or a second dielectric in contact with the p-metallization. That is, the first dielectric of the first mirror may be in direct physical contact with the p-metallization. In particular, the second dielectric may be in direct physical contact with electrically conductive portions of the first mirror.

The optoelectronic semiconductor chip may comprise a semiconductor body having an n-conducting region, a p-conducting region and an active region, between which the n-conducting region and the p-conducting region are arranged. The optoelectronic semiconductor chip further comprises a first mirror including a first metallic layer and a p-metallization including a second metallic layer, wherein, in operation of the semiconductor chip, the first mirror is not at the same electrical potential as the p-conducting region. During operation of the optoelectronic semiconductor chip, the p-metallization has the same electrical potential as the p-conducting region. The first mirror has at least one opening through which the p-metallization electrically conductively connects to the p-conducting region.

An optoelectronic semiconductor chip described here is based inter alia on the following considerations. In optoelectronic semiconductor chips, for example, light-emitting diode chips, it is possible to use a mirror having a metallic layer. Advantageously, the metallic layer is arranged as close as possible to the semiconductor body and comprises a material advantageously having a high reflectivity for the electromagnetic radiation generated in the semiconductor chip. This material may be a material which, in the electric field, especially when in contact with moisture, tends to form ions, which in turn tend to migrate in the electric field. Cations, in particular, are prone to migration and can therefore cause electrical shunts that reduce the efficiency of the component or lead to failure of the component.

The semiconductor chip described here makes use, inter alia, of the idea that the first mirror comprising metallic layers is set to a potential not corresponding to the potential of the p-conducting region. The material of the first metallic layer of the first mirror, when it is at a potential different from the p-conducting region, is much less sensitive to moisture since the migration tendency is greatly reduced.

Advantageously, by this arrangement, the risk of formation of cations can be reduced, which leads to improved reliability and improved moisture resistance of the optoelectronic semiconductor chip. In addition, due to the reduced risk of formation of cations, the first mirror can be arranged particularly close to the semiconductor body, as a result of which electromagnetic radiation generated in the semiconductor chip can be efficiently reflected and subsequently decoupled.

The first mirror of the optoelectronic semiconductor chip may be at the same potential as the n-conducting region. That is, any potential difference between the first mirror and the n-conducting region results only from the contact resistance between the first mirror and the n-conducting region. In this case, the electrically conductive part of the first mirror, in particular the first metallic layer, can connect to the n-conducting region of the semiconductor body in an electrically conductive manner via a first via and be in physical contact with it directly. The first via extends at least partially through the semiconductor body. In particular, the p-conducting region and the active region are penetrated by the first via. Parallel to the main extension plane of the semiconductor body, the first via may, for example, have a circular, oval or polygonal contour.

The n-conducting region of the semiconductor body can be electrically conductively contacted and operated via the first mirror. Advantageously, the fact that the first metallic layer is at the same potential as the n-conducting region greatly reduces the risk of formation of cations.

The first metallic layer may contain or consist of one or a combination of the following elements: Ag (silver), Al (aluminum), Rh (rhodium), Au (gold). The elements mentioned can be present as compounds or in elemental form in the first metallic layer. A first metallic layer of rhodium is advantageously particularly inert and thus has a high chemical stability. Preferably, the first metallic layer is formed with silver, which advantageously has a particularly high reflectivity for light in the visible wavelength range, in particular in the wavelength range of blue light. Surprisingly, I found that silver, when it is at the same potential as the n-conducting region, does not tend to form cations and thus there is a low risk of migration of such ions.

The surface portion of the first mirror facing the active region may be greater than the surface portion of the p-metallization facing the active region. The portion of the surface of the first mirror or of the p-metallization facing the active region can, in particular, run parallel to the main extension plane of the active region. Further, a portion of the first mirror or p-metallization may penetrate the active region. That is, the active region may have openings in which the first mirror or the p-metallization runs.

The first mirror has a particularly high reflectivity for electromagnetic radiation generated in the active region. Thus, by a large surface portion of the first mirror facing the active region, electromagnetic radiation generated in the active region is advantageously reflected particularly efficiently.

The first mirror may have a reflectivity greater than the reflectivity of the p-metallization. In particular, the side of the first mirror facing the active region has a higher reflectivity than the side of the p-metallization facing the active region. For example, the first metallic layer may be formed of a material having a higher reflectivity than the material of the second metallic layer. Advantageously, the efficiency of the optoelectronic semiconductor chip is improved by a high reflectivity of the first mirror. In this case, it is possible for the first metallic layer to be formed with a material having a high tendency to migrate in the electric field. For example, the first metallic layer consists of silver or aluminum. The second metallic layer of the p-metallization is then formed with a metal such as rhodium, having a low tendency to migrate in the electric field.

The main extension plane of the first mirror may be arranged between the semiconductor body and the p-metallization.

In other words, the first mirror is arranged completely or largely between the p-metallization and the semiconductor body. "For the most part" means that at least 50%, preferably at least 65%, for example, at least 80% of the material of the first mirror is arranged between the p-metallization and the semiconductor body. Advantageously, due to the arrangement of the main extension planes of the first mirror, the semiconductor body and the p-metallization, a larger part of the generated light hits the first mirror than the p-metallization. In particular, at least 25%, preferably at least 30%, for example, at least 40%, of the light generated strikes the first mirror. Since the first mirror has a particularly high reflectivity for the light generated, this arrangement leads to a particularly high efficiency of the component.

The first mirror may have an opening and the p-metallization is arranged at least partially in the opening of the first mirror. The opening of the first mirror extends completely from the side facing the semiconductor body in the direction of the side facing away from the semiconductor body through the mirror. At least the second metallic layer is disposed in the opening. Electrically conductive parts of the first mirror are not in direct contact with electrically conductive parts of the p-metallization in the region of the opening. In the region of the opening, a dielectric, that is to say an electrically insulating material, is arranged between the electrically conductive parts of the first mirror and the electrically conductive parts of the p-metallization in the lateral direction.

The opening in the first mirror and the material arranged within the opening form, for example, a second via, by which the p-conducting region and the p-metallization electrically conductively connect. The opening in the first mirror has, for example, a circular, oval or polygonal contour in the main extension plane of the first mirror. The p-metallization then has a circular, oval or polygonal contour within the opening of the first mirror parallel to the main extension plane of the first mirror, wherein the lateral extent, for example, the radius of the contour of the second metallic layer, is smaller than the lateral extent of the contour of the opening in the first metallic layer. Through the opening in the first mirror, the p-conducting region and the second metallic layer electrically conductively connect to one another.

In particular, in a semiconductor chip, the number of first vias is smaller than the number of second vias. For example, the number of second vias is three to five times higher than the number of first vias. Advantageously, the generated electromagnetic radiation strikes the p-metallization in regions of the openings of the first mirror. Thus, electromagnetic radiation is also reflected in the region of the second vias, whereby the efficiency of the semiconductor chip is increased.

The first metallic layer, on the sides facing the active region, may be covered by a first dielectric. The first dielectric is in direct physical contact with the first metallic layer and covers the first metallic layer at its surfaces facing the active region at least partially, in particular completely up to contact surfaces to the semiconductor body. In addition, the first dielectric can cover further sides of the first metallic layer.

The first dielectric is a low refractive index material having a refractive index of at most 1.5 at a wavelength of 450 nm, for example, silicon oxide ($SiO_2$). Electromagnetic radiation incident on the first dielectric at a smaller angle than the critical angle of total reflection is reflected with extremely low loss. Only electromagnetic radiation incident on the first dielectric at a greater angle than the critical angle of total reflection strikes the first metallic layer.

Alternatively, the first dielectric may be formed of a plurality of layers having different indices of refraction such that a Bragg mirror is formed from the different layers. In this case, for example, one of the layers comprises silicon dioxide and another of the layers comprises titanium dioxide.

Analogously, the second metallic layer, on the sides facing the active region, may at least partially be covered by a second dielectric. The second dielectric is in direct physical contact with the second metallic layer and covers the second metallic layer at its surfaces facing the active region at least partially, in particular, except for contact surfaces to the semiconductor body. In addition, the second dielectric can cover further sides of the second metallic layer. The second dielectric may be a material having a low refractive index, for example, silicon oxide ($SiO_2$).

The second dielectric may consist of several layers of different materials with different refractive indices, thereby forming a Bragg mirror.

The first dielectric may in places be in direct physical contact with the second metallic layer. The second dielectric may in places be in direct physical contact with the first metallic layer. Particularly in areas of vias through the first mirror or p-metallization, the electrically conductive portions of the first mirror may be in direct physical contact with the second dielectric, in particular a p-metallization layer. In regions of vias through the first mirror or p-metallization, the electrically conductive portions of the p-metallization may be in direct physical contact with the first mirror. In this case, the first or the second dielectric serves as an electrically insulating layer between the first and second metallic layer.

In addition, the first and the second dielectric may have a particularly high hermeticity. Thus, in areas where the first or second dielectric covers the first or second metallic layer, penetration of moisture to the first or second metallic layer is reduced. In particular, the first and/or the second dielectric makes it possible to form the first and/or second metallic layer with materials susceptible to migration in the electric field, for example, silver (Ag) or aluminum (Al).

Advantageously, the reflectivity of the first mirror and/or the p-metallization can be increased by the first and/or the second dielectric. If a low-refractive dielectric, for example, silicon oxide is arranged in front of the metal mirror, in particular the p-metallization, this leads to total reflection at small angles of incidence of electromagnetic radiation and can be advantageous in combination with a metallic mirror located behind it. The reflectivity of the first mirror and/or the p-metallization can be further increased if the dielectric is formed as a layer stack of different dielectrics to form a Bragg mirror. A Bragg mirror advantageously additionally has a high reflectivity for electromagnetic radiation, which impinges on the first and/or second mirror at small angles.

The first mirror may project beyond the semiconductor body in lateral directions. The first mirror extends substantially parallel to the main extension plane of the semiconductor body. At least partially, the first mirror, parallel to the growth direction of the semiconductor body, is not covered by the semiconductor body. In particular, the first metallic layer is not completely covered by the semiconductor body perpendicular to the main extension plane of the first mirror.

In areas where the first metallic layer is not covered by the semiconductor body, there is an increased risk of penetration of moisture to the first metallic layer. Advantageously, the first metallic layer does not tend to form cations, in particular Ag+ ions so that the first metallic layer can also be arranged in areas that are not covered by the semiconductor body. As a result, the reflective surface is increased and the efficiency of the optoelectronic semiconductor chip is improved. By way of example, the reflective surface is 5% to 10% larger than that of the surface of the semiconductor body, parallel to the main extension plane of the semiconductor body.

For example, thin-film LEDs can have at least one first contact structure, which is accessible from the side of the optoelectronic semiconductor chip facing the semiconductor body and is arranged laterally next to the semiconductor body. In this case, the first metallic layer may project beyond the semiconductor body in lateral directions. Thus, the first contact structure, which electrically conductively connects to the n-conducting region by the first metallic layer, can connect directly to the first metallic layer. Advantageously, due to this arrangement, no further electrically conductive structure is necessary to electrically connect the first contact structure to the first metallic layer.

I found that the surface portion of the first mirror, due to its electrical contact with the n-conducting region, can be increased. A mirror formed with silver (Ag) need not be completely covered by the semiconductor stack since the risk of formation of Ag+ ions is reduced. This is particularly possible because during operation of the semiconductor chip, the first mirror is not at the same electrical potential as the p-conducting region.

From the larger surface of the first mirror results a higher reflectivity of the optoelectronic semiconductor chip, which has a positive effect on the efficiency of the optoelectronic semiconductor chip.

The p-metallization may be at least partially formed from the same material as the first mirror. In particular, the second metallic layer is partially formed of the same material as the first metallic layer. The second metallic layer may comprise a plurality of metallic materials deposited in separate process steps. In this case, a metallic material of the second metallic layer can be deposited in the same process step as at least part of the first metallic layer. In particular, the part of the second metallic layer, which is arranged in an opening of the first metallic layer in the region of a second via, is formed from the same material as the first metallic layer. The metallic layers of the first mirror and the p-metallization, formed of the same material, are not electrically conductively connected to each other.

For example, the first and the second metallic layer are separated from each other by a recess having an annular or frame-shaped contour parallel to the main extension plane and filled with an electrically insulating material. In particular, the electrically insulating material may be formed by the first and/or second dielectric.

Since the first metallic layer locally assumes the function of the second metallic layer, formations of the recess in the first and second dielectric can advantageously take place in two separate process steps. As a result, the required etching depth is reduced by the first and second dielectrics. With the same aspect ratio of the etching process, it is thus possible to realize recesses having a reduced size in the lateral direction.

The first mirror and the n-conductive region may electrically conductively connect to one another by a third via, wherein the third via completely penetrates the semiconductor body, perpendicular or transverse to the main extension plane of the semiconductor body.

The third via extends completely through the p-type, n-type, and active regions. In this case, the end faces of the third via hole that connect the side of the semiconductor body facing the first mirror to the side of the semiconductor body facing away from the first mirror, are completely covered with an electrically insulating material. An electrically conductive material is disposed in the third via, wherein the electrically conductive material is not in direct physical contact with the end faces of the third via. The electrically conductive material connects the n-conducting region and the first mirror in an electrically conductive manner with one another. In this case, the n-conducting region is arranged on the side of the active region facing away from the first mirror. The first mirror electrically conductively connects via the electrically conductive material to the side of the n-conductive region facing away from the first mirror.

The p-metallization may have a fourth via through which an electrically conductive first contact structure extends. In this case, the first contact structure electrically conductively connects to the first mirror. The fourth via in the p-metallization can have a circular, oval or polygonal contour parallel to the main extension plane of the p-metallization. The first contact structure, which is guided through the opening of the p-metallization, electrically conductively connects to the first mirror so that the first metallic layer can be electrically contacted by the first contact structure. That is, the first contact structure may have an outwardly exposed surface over which the first metallic layer may be electrically contacted. For example, the first contact structure may be formed from a metal, in particular gold, or a solder.

The first contact structure is surrounded by a dielectric in the region of the fourth via on all lateral sides so that there is no direct physical contact between the first contact structure and the second metallic layer.

In particular, the fourth via allows a flip-chip structure in which a respective first contact structure for the n-conducting region and a second contact structure for the p-conducting region are arranged on the rear side opposite the emission side.

Advantageously, the first metallic layer has no surfaces exposed to the outside, whereby the first metallic layer is particularly well protected against environmental influences, which in turn improves the reliability of the semiconductor chip.

The active region may be completely surrounded by the first mirror in lateral directions. For example, the first via formed with the first metal layer may completely surround the active region in lateral directions. In particular, the first via, parallel to the main extension plane of the semiconductor body, may have a grid-shaped structure. That is, the first via divides the active region of a semiconductor chip into a plurality of partial regions, also called pixels that are each completely surrounded by the first metallic layer in lateral directions. Similarly, the p-conducting region, from the first via, is subdivided into a plurality of subregions that are each completely surrounded by the first metallic layer in lateral directions.

For example, an n-conducting region can be electrically contacted by the first metallic layer, which in turn electrically conductively connects to a plurality of active regions not in direct physical contact. The p-conducting regions of the individual active regions can be contacted and energized separately so that the active regions can be operated separately from one another. The sum of the first and second contact structures of the semiconductor chip is at least one greater than the sum of the separately controllable active regions. The first and second contact structures are electrically coupled to a drive circuit to drive the individual pixels. In particular, in an optoelectronic semiconductor chip with separately controllable pixels, the growth substrate can be removed. Advantageously, this increases the pixel-pixel contrast. If the active region is completely surrounded by the first mirror in lateral directions, then advantageously the proportion of the electromagnetic radiation leaving the semiconductor chip in lateral directions is reduced. A further advantage is that a pixelated semiconductor chip with separately operable active regions is made possible by a grid-shaped arrangement of the first via.

The first metallic layer may be covered on all sides with electrically insulating material. In this case, the first mirror is exclusively in direct physical contact with electrically insulating material. That is, the first metallic layer is not electrically connected to the n-type or the p-conducting region.

The first metallic layer may be in direct physical contact with only the first and/or the second dielectric. That is, the entire outer surface of the first metallic layer is completely covered by the first and/or second dielectric. In particular, the first metallic layer on the sides facing the active region is in direct contact with the first dielectric and on the sides facing the active region in direct contact with the first and/or second dielectric. Advantageously, in this example, the first metallic layer is particularly well encapsulated so that the material of the first mirror is protected from moisture.

The second metallic layer may be free of silver. The second metallic layer comprises, for example, rhodium (Rh) and/or aluminum (Al). In particular, the second metallic layer comprises only materials that are chemically inert, thus reducing the risk of ion formation.

The p-conducting region and the p-metallization may be at the same potential during operation of the semiconductor chip. Experience has shown that when the second metallic layer contains silver, Ag+ ions may form during operation of the semiconductor chip. The Ag+ ions are prone to electromigration, which can cause shunts in the semiconductor chip. Advantageously, a semiconductor chip is particularly robust to moisture and reliably operable when metallic materials that are at the same potential as the p-conducting region are free of silver.

In the following, the optoelectronic semiconductor chip described here will be explained in more detail on the basis of examples and associated figures.

The same, similar or equivalent elements are provided in the figures with the same reference numerals. The figures and the proportions of the elements shown in the figures with each other are not to be considered to scale. Rather, individual elements may be exaggerated in size for better representability and/or better intelligibility.

FIG. 1A shows a schematic sectional illustration of an optoelectronic semiconductor chip 1 according to a first example. The optoelectronic semiconductor chip 1 comprises a semiconductor body 30. The semiconductor body 30 comprises an n-conducting region 301, a p-conducting region 302 and an active region 303. The present n-conducting region 301 is made of an n-doped nitride compound semiconductor material educated. The p-conducting region 302 is formed of a p-type nitride compound semiconductor material. Between the n-type and the p-conducting region, the active region 303 is arranged. The active region 303 is set up to generate electromagnetic radiation in the visible wavelength range during normal operation of the semiconductor chip 1.

Furthermore, the optoelectronic semiconductor chip 1 comprises a first mirror 10 and a p-metallization 20. The first mirror 10 comprises a first metallic layer 101 and a first dielectric 102. The first metallic layer 101 of the first mirror 10 contains, for example, silver, aluminum or rhodium. In particular, the first metallic layer 101 is made of silver. The first dielectric 102 is arranged on the side of the first metallic layer 101 facing the active region. The first dielectric 102 has a particularly low permeability to moisture and may be formed, for example, of silicon oxide, $SiO_2$. In addition, the optoelectronic semiconductor chip 1 comprises a p-metallization 20, which comprises or consists of a second metallic layer 201. Adjacent to the p-metallization, a second dielectric 202 is arranged, which in particular can form a second mirror together with the p-metallization.

The second metallic layer 201 is formed of, for example, rhodium or aluminum. The second dielectric has a particularly low permeability to moisture and is formed, for example, of silicon oxide, silicon nitride or aluminum dioxide. Both the first mirror 10 and the p-metallization 20 extend within the manufacturing tolerance parallel to the main extension plane of the semiconductor body 30. The first mirror 10 is arranged on the side facing away from the active region 303 of the p-conducting region 302. The p-metallization 20 is arranged on the side of the first mirror 10 facing away from the semiconductor body 30. The first metallic layer 101 and the second metallic layer 201 are not directly electrically connected to each other. The first dielectric 102 may be directly in physical contact with the second metallic layer 201 and/or the second dielectric 202. The second dielectric 202 may be in direct physical contact with the first dielectric 102 and/or the first metallic 101 layer.

The semiconductor body 30 has a first via 61, by which the first metallic layer 101 connects in an electrically conductive manner to the n-conductive region 301. The first via 61 has a circular contour parallel to the main extension plane of the semiconductor body 30. In particular, the electrically conductive connection of the first via 61 between the n-conducting region 301 and the first metallic layer 101 may be formed of the same material as the first metallic layer 101. In addition, another electrically conductive material may be disposed in the contact region of the first metallic layer 101 and the n-conducting region 301. The first metallic layer 101 is electrically insulated from the p-conducting region 302 and the active region 303 of the semiconductor body 30 by the first dielectric 61.

In addition, the p-metallization 20 electrically conductively connects to the p-conducting region 302 by a second via 62. That is, the first mirror 10 has at least one opening through which the p-metallization 20 electrically conductively connects to the p-conducting region 302 of the semiconductor body 30. In particular, the electrically conductive connection of the p-conducting region 302 and the second metallic layer 201 may be formed from the material of the second metallic layer 201.

In the contact region between the second metallic layer 201 and the p-conducting region 302, a second current spreading layer 432 is arranged. The second current spreading layer 432 is characterized by a high lateral conductivity parallel to the main extension plane of the semiconductor body 30. In particular, the second current spreading layer 432 is formed of a transparent material such as a transparent conductive oxide, for example, ITO having a particularly low absorption or reflection of the electromagnetic radiation generated in the active region 303. The second via 62 has, for example, a circular contour along the main extension plane of the first mirror 10.

The p-metallization 20 is in direct physical contact with a solder layer 40. The solder layer 40 completely covers the p-metallization on the side facing away from the first mirror. The solder layer 40 serves both the electrical contacting of the second metallic layer 201 and the encapsulation of the second metallic layer 201. In particular, the solder layer 40 has a particularly low permeability to moisture. On the p-metallization 20 side facing away from the solder layer 40, a carrier 41 is arranged. The carrier 41 is in direct physical contact with the solder layer 40. The carrier 41 gives the optoelectronic semiconductor chip at least partially its mechanical stability. The p-conducting region 302 of the semiconductor body 30 is contacted by the carrier 41 in an electrically conductive manner. That is, during operation of the semiconductor chip 1, the carrier 41 is at substantially the same electrical potential as the p-conducting region 302. The carrier may be formed, for example, with silicon, germanium, or a metal.

In regions between the first mirror 10 and the p-metallization 20, an electrically conductive first current spreading layer 431 may be arranged. In particular, the electrically conductive first current spreading layer 431 is in direct physical contact with the first metallic layer 101 and a first contact structure 421. The first metallic layer 101 is electrically conductively contactable from the outside by the first contact structure 421. For example, the first contact structure 421 is formed of metal, in particular gold. During operation of the optoelectronic semiconductor chip 1, the semiconductor body 30 is contacted and operated by the first contact structure 421 and the solder layer 40.

In FIG. 1A, the first metallic layer 101 is not completely covered by the semiconductor body 30 perpendicular to its main extension direction. That is, the first metallic layer 101 projects beyond the semiconductor body 30 in at least one lateral direction.

Figure 1B:
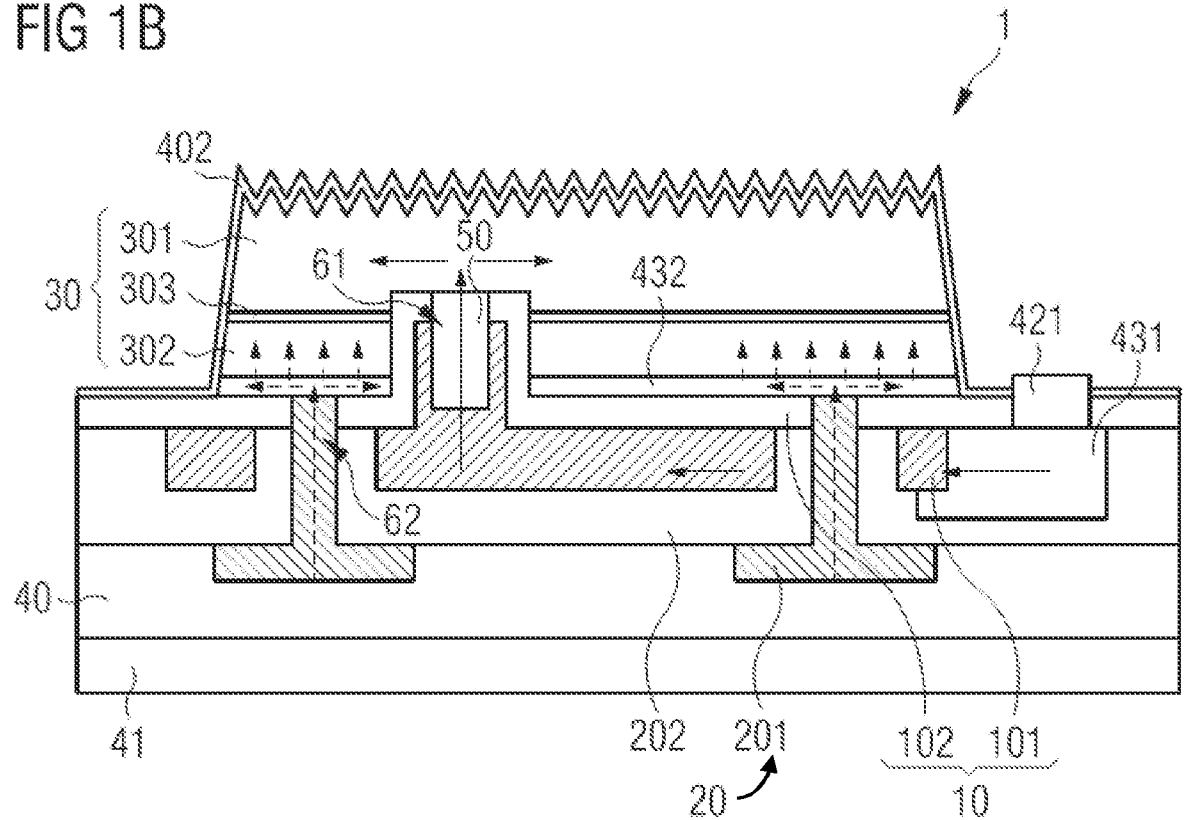

FIG. 1B shows a schematic sectional illustration of an optoelectronic semiconductor chip 1 according to a second example. The second example, in comparison to the first example, see FIG. 1A, shows an alternative example of the first current spreading layer 431, which is in direct contact with the first metallic layer 101. In this case, the first current spreading layer 431 is arranged such that the semiconductor body 30 does not completely overlap with it in the vertical direction. In turn, the first metallic layer 101 has an increased thickness compared to the first example, resulting in a higher transverse conductivity in the first metallic layer 101.

Figure 1C:
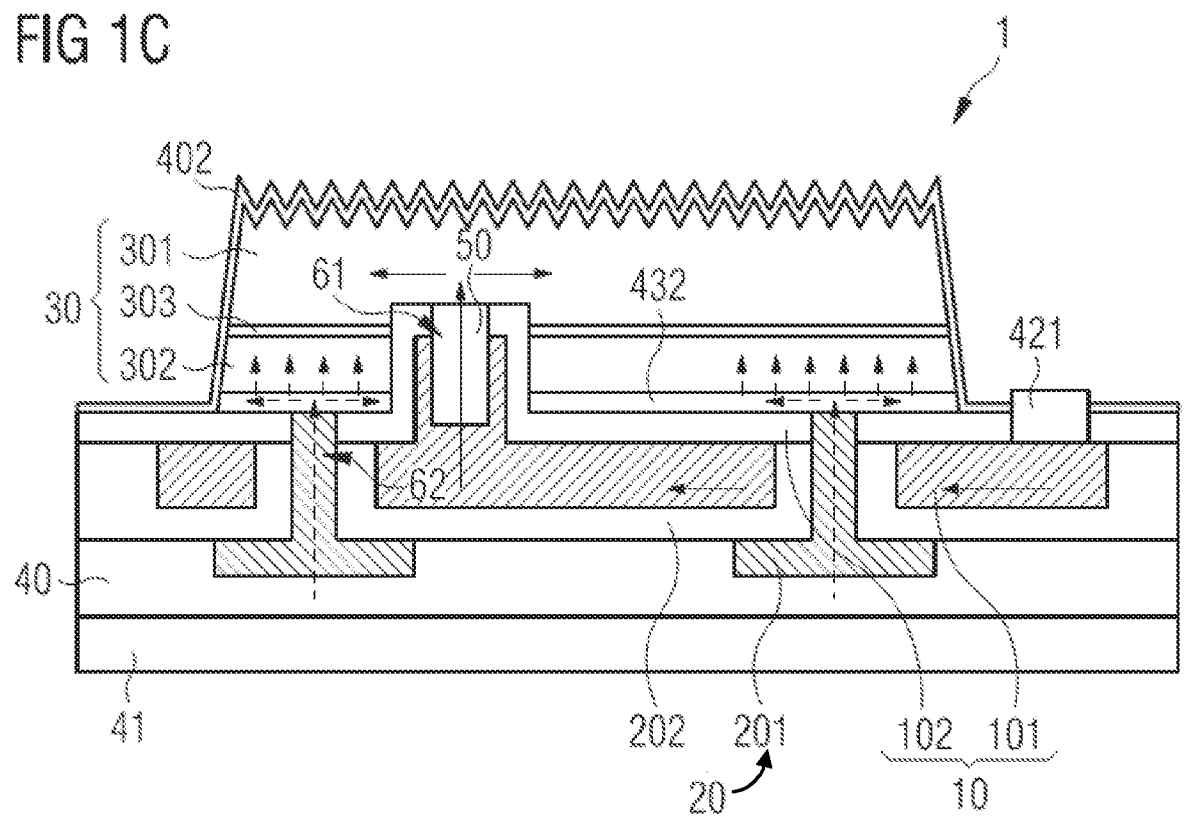

FIG. 1C shows a schematic sectional illustration of an optoelectronic semiconductor chip according to a third example. In contrast to the second example, see FIG. 1B, in the third example no first current spreading layer 431 is arranged between the first contact structure 421 and the first metallic layer. In this case, the first metallic layer projects beyond the semiconductor body in all lateral directions.

Figure 2:
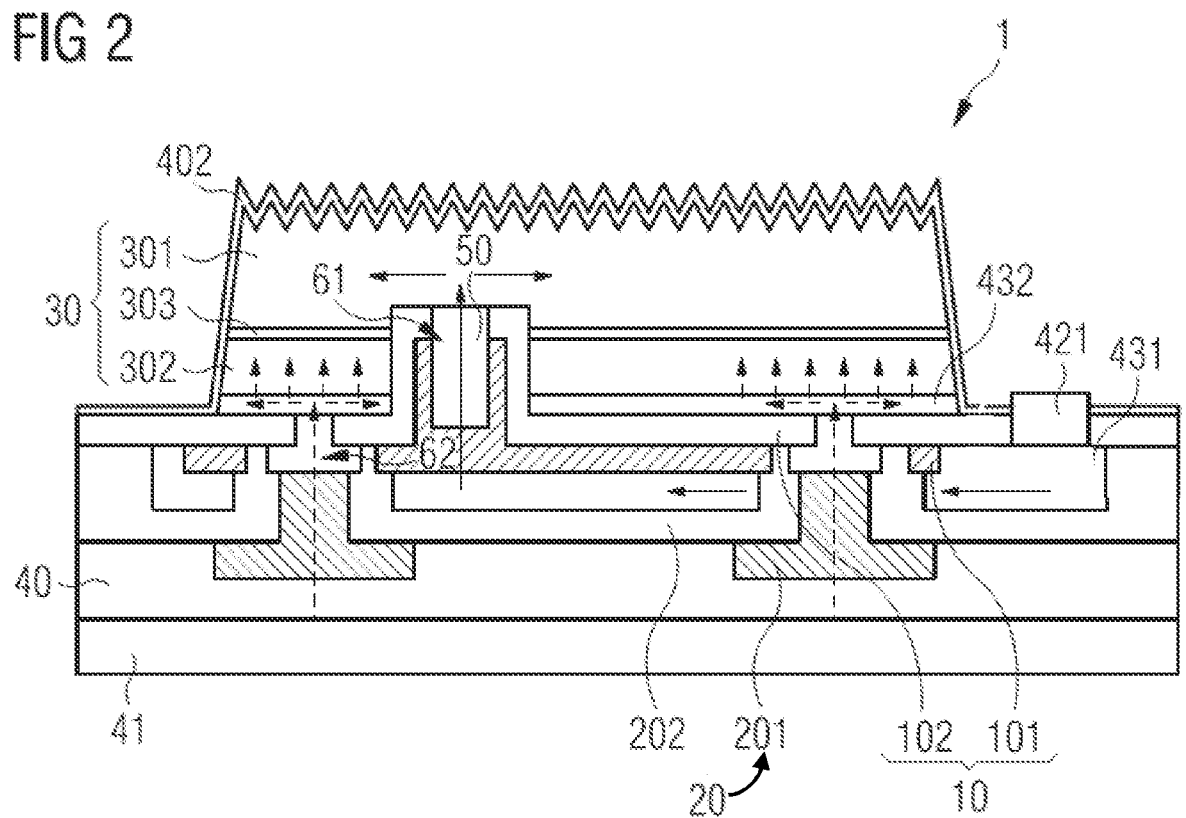

FIG. 2 shows a schematic sectional illustration of an optoelectronic semiconductor chip 1 according to a fourth example. The fourth example differs from the first example in the structure of the second via 62 that electrically conductively connects the second metallic layer 201 and the second current spreading layer 432 disposed on the p-conducting region 302. The first metallic layer 101 has, in the region of the second via 62, a recess having an annular contour parallel to the main extension direction of the first metallic layer 101. The recess extends completely perpendicular to the main extension direction of the first metallic layer 101 through the first metallic layer 101. In the center of the annular recess, electrically conductive material is arranged that consists of the same material as the first metallic layer. The material disposed in the center of the annular recess is in direct physical contact with the second metallic layer 201 and the second current spreading layer 432. In particular, the material disposed in the center of the annular recess is of the same material as the first metallic one Layer formed and was deposited in the same process step.

Advantageously, the electrically conductive material is arranged in the center of the second via 62 in a self-adjusting process by the annular recess. That is, the tolerances for the positioning accuracy of the second metallic layer 202 relative to the first metallic layer 201 in the lateral direction are greater than in the first example, see FIG. 1A. As a result, the manufacturing process of the semiconductor chip is simplified.

Figure 3:
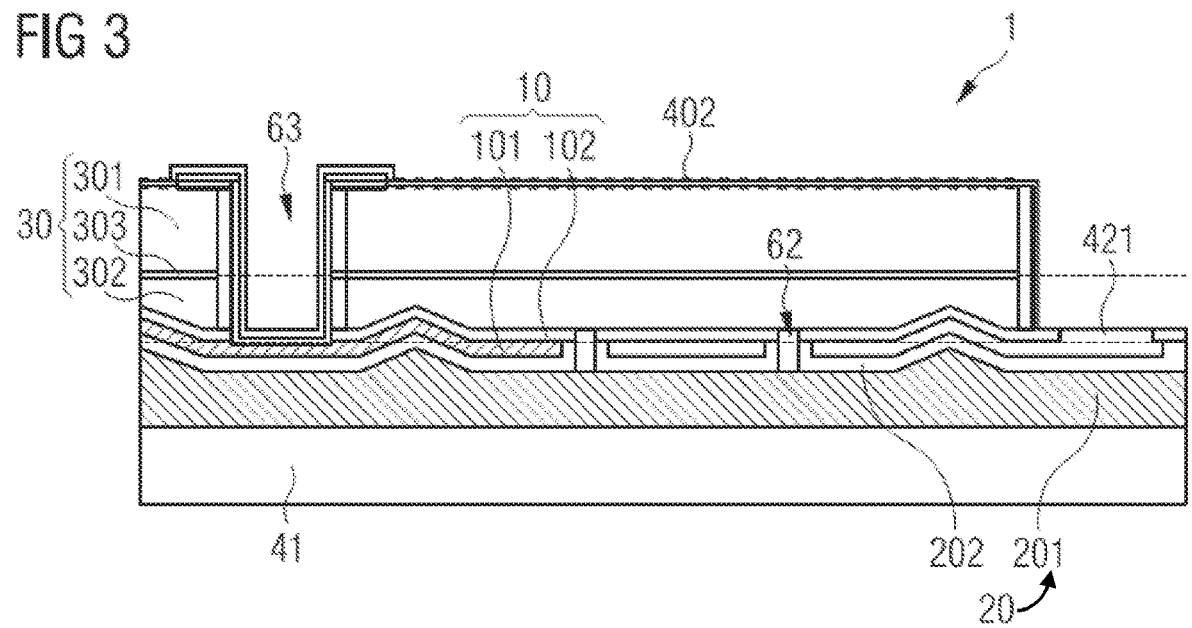

FIG. 3 shows a schematic sectional representation of an optoelectronic semiconductor chip 1 according to a fifth example. The fifth example shows an optoelectronic semiconductor chip 1 comprising a carrier 41. On the carrier 41, the second metallic layer 201 is disposed on a main surface. The second metallic layer 201 may be formed of a solder material, gold, rhodium, aluminum or silver. On the side facing away from the carrier 41 side of the second metallic layer 201, the second dielectric 202 is disposed. The second dielectric 202 is in direct physical contact with the second metallic layer 201.

On the side of the second dielectric 202 remote from the second metallic layer 201, a first metallic layer 101 is arranged. The first metallic layer 101 is formed of aluminum or silver. On the side of the first metallic layer 101 facing away from the second dielectric 202, a first dielectric 102 is arranged. The first dielectric 102 covers the first metallic layer 101 on its side facing away from the second metallic layer 201.

The first dielectric 101 may be formed of silicon oxide, for example. On the side of the first dielectric 102 remote from the first metallic layer 101, a semiconductor body 30 is arranged. The semiconductor body 30 comprises an n-conducting region 301, a p-conducting region 302 and an active region 303. The main extension plane of the semiconductor body 30 extends parallel to the main extension plane of the carrier 41. The active region 303 is located between the n-conducting region 301 and the p-conducting region, wherein the p-conducting region 302 is in direct physical contact with the first dielectric 102.

The semiconductor body 30 has a third via 63 extending completely through the semiconductor body 30 in the vertical direction perpendicular to the main extension plane of the semiconductor body 30. The third via 63 also extends completely through the first dielectric 102 in the vertical direction. The third via 63 electrically conductively connects the first metallic layer 101 to the n-conducting region 301 of the semiconductor body 30. The third via 63 points in the main extension plane of the semiconductor body 30 and preferably has a circular contour.

The side surfaces of the third via 63 are the surfaces connecting the side of the semiconductor body 30 facing away from the carrier 41 to the side of the semiconductor body 30 facing the carrier 41. These side surfaces are coated with an electrically insulating material. In the region of the third via 63, an electrically conductive material is arranged, and connects the first metallic layer 101 and the n-conductive region 301 in an electrically conductive manner. In this case, the electrically conductive material is not in direct physical contact with the side surfaces of the third via 63. That is, the side surfaces are in direct contact only with electrically insulating material.

The optoelectronic semiconductor chip has, according to the fifth example, see FIG. 3, a second via 62. The second via 62 extends vertically through the first dielectric 102, the first metallic layer 101, and the second dielectric 202. The second via 62 is formed from an electrically conductive material and electrically connects the p-conducting region 302 to the second metallic layer 201. Parallel to the main extension plane of the carrier 41, the second via 62 has a circular contour. The electrically conductive material of the second via 62 may include, for example, rhodium, gold, aluminum or silver. In particular, the electrically conductive material of the second via 62 may comprise platinum, gold or indium tin oxide.

Furthermore, the optoelectronic semiconductor chip according to the fifth example has a first contact structure 421. The first contact structure 421 has an outwardly exposed surface and electrically conductively connects to the first metallic layer 101. During operation of the optoelectronic semiconductor chip 1, the semiconductor body is electrically contacted and energized via the first contact structure 421 and the carrier 41.

In addition, surfaces of the semiconductor body 30 not formed by the third via 63 or not in direct contact with the second via 62 or the first dielectric 102 are covered by a third dielectric 402. Advantageously, the third dielectric 402 protects the semiconductor body 30 from environmental influences such as moisture.

Figure 4:
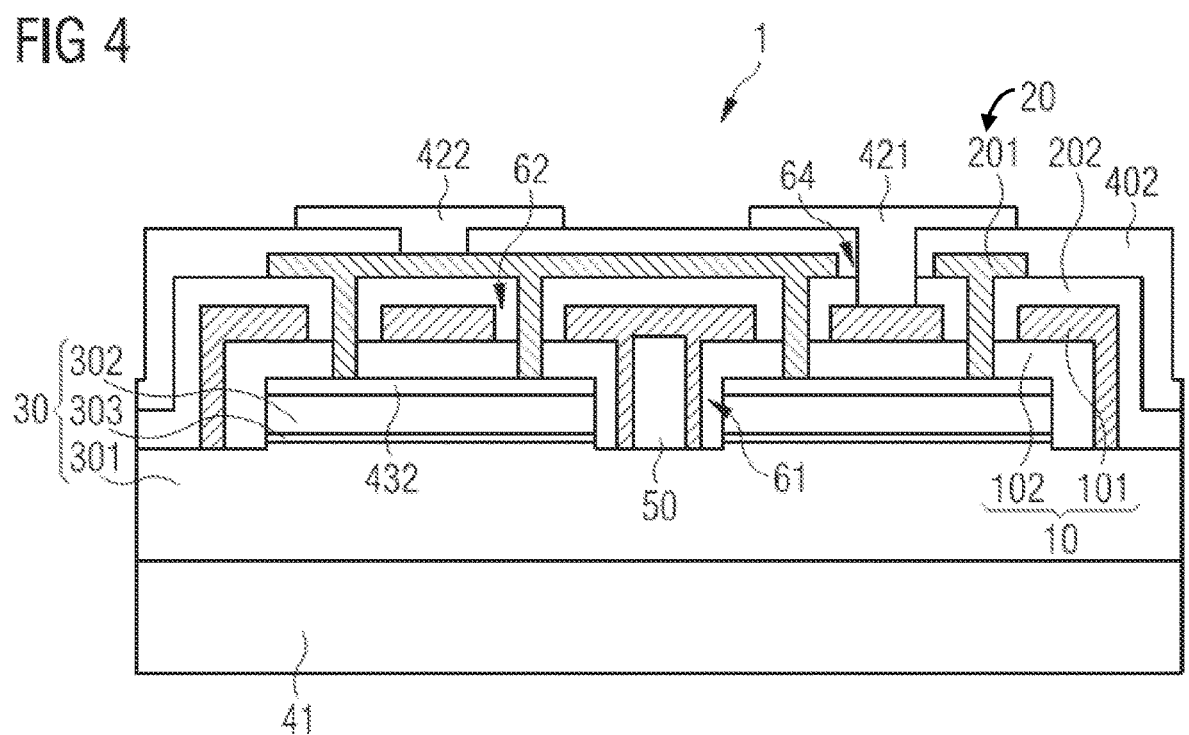

FIG. 4 shows a schematic sectional illustration of an optoelectronic semiconductor chip 1 according to a sixth example. The optoelectronic semiconductor chip 1 comprises a carrier 41 on the surface of which a semiconductor body 30 is arranged. In particular, the carrier 41 may be a growth substrate on which the semiconductor body has grown epitaxially. The semiconductor body 30 comprises an n-conducting region 301, a p-conducting region 302 and an active region 303. The n-conducting region 301 is arranged on a main surface of the carrier 41, the n-conducting region and the carrier being in direct physical contact. The active region 303 is arranged on the side of the n-conducting region 301 facing away from the carrier, and the p-conducting region 302 is arranged on the side of the active region 302 facing away from the n-conducting region 301. On the side of the p-conducting region 302 facing away from the active region 303, a second current spreading layer 432 is arranged, through which the p-conducting region 302 of the semiconductor body is electrically contacted.

On the side facing away from the carrier 41 of the semiconductor body 30, a first mirror 10 is arranged. The first mirror 10 comprises a first metallic layer 101 and a first dielectric 102. The first metallic layer 101 electrically conductively connects to the n-conducting region 301. In this case, the first metallic layer 101 is in direct physical contact with the n-conducting region 301. In the region of the first via 61, a further electrically conductive material 50 is arranged in the contact region between the first metallic layer 101 and the n-conducting region 301. The further electrically conductive material 50 is, for example, transparent conductive oxide, in particular indium tin oxide. Advantageously, the further electrically conductive material reduces the electrical contact resistance between the first metallic layer 101 and the n-conducting region 301.

The second current spreading layer 432, the p-conducting region 302, and the active region 303 are completely penetrated by a first via 61 obliquely to its main extension direction. The side surfaces of the first via 61 are completely covered by the first dielectric 102. The first metallic layer 101 electrically conductively connects to the n-conducting region 301 by the first via 61. The material that electrically conductively connects the n-conducting region 301 to the first metallic layer 101 is the same material as that of the first metallic layer 101.

The n-conducting region 301 projects beyond the active region 303 and the p-conducting region 302 in lateral directions. In this case, the first metallic layer 101 and the first dielectric 102 are disposed on the side surfaces of the p-conducting region 302 and the active region 303. Thus, the first metallic layer 101 additionally electrically conductively connects to the n-conducting region 301 in further regions outside the first via 61. That is, the first mirror 10 projects beyond the p-conducting region 302 and the active region 303 in lateral directions. In this case, all the sides of the first metallic layer 101 facing the active region 303 are covered by the first dielectric 102. In particular, the active region 303 is completely surrounded by the first mirror 10 in lateral directions, and the first metallic layer 101 is at the same potential as the n-conducting region 301.

On the side facing away from the semiconductor body 30 side of the first mirror 10, a p-metallization 20 is arranged. The p-metallization 20 includes a second metallic layer 201. Further, a second dielectric 202 may be disposed in contact with the p-metallization. The second dielectric 202 is in direct physical contact with the first metallic layer 101. The main extension plane of the p-metallization 20 extends substantially parallel to the main extension plane of the first mirror 10 and the semiconductor body 30.

The first mirror 10 has a second via 62 extending completely through the first mirror 10 in the vertical direction. The second metallic layer 201 electrically conductively connects to the second current spreading layer 432 by the second via 62. The electrically conductive connection between the second metallic layer 201 and the second current spreading layer 432 may be formed from the same material as the second metallic layer 201. The side surfaces of the electrically conductive connection between the second metallic layer 201 and the second current spreading layer 432 extends completely through the first dielectric 102 and the second dielectric 202, respectively. The p-conducting region 302 is contacted in an electrically conductive manner by the second metallic layer 201 and the n conductive region 301 is electrically conductively contacted by the first metallic layer 101 so that the semiconductor body 30 can be energized via the first 101 and second metallic layer 201. The first metallic layer 101 and the second metallic layer 201 are not directly electrically connected to each other.

The lateral conductivity of the n-conducting region 301 may be greater than the lateral conductivity of the second current spreading layer 432. Advantageously, the current density in the active region 303 is homogeneous during operation. A high number of the second vias 62 enables a homogeneous current injection into the active region 303. In particular, the number of second vias 62 is greater than the number of first vias 61.

On the side facing away from the first mirror side of the p-metallization 20, a third dielectric 402 is arranged. The third dielectric 402 covers the surfaces of the second dielectric 202 facing away from the semiconductor body 30. On the side of the third dielectric 402 remote from the p-metallization, first 421 and second 422 contact structures are arranged. The third dielectric 402 has at least one opening completely penetrated by the second contact structure 422 so that the second contact structure 422 is connected in an electrically conductive manner to the second metallic layer 201.

In addition, the optoelectronic semiconductor chip 1 has a fourth via 64 that completely penetrates the third dielectric 402, the second dielectric 202 and the second metallic layer 201 obliquely to its main extension direction. Through the fourth via 64, the first contact structure 421 electrically conductively connects to the first metallic layer 101. The side surfaces of the electrically conductive connection between the first contact structure 421 and the first metal layer 101 are completely covered by the second dielectric 202 and/or the third dielectric 402. That is, the second metallic layer 201 is not electrically connected to the via 64.

According to the example shown in FIG. 4, the first metallic layer 101 and the second metallic layer 202 have no surfaces exposed to the outside. That is, all surfaces of the first metallic layer 101 and the second metallic layer 201 are in direct contact with either the semiconductor body 30, the current spreading layer 432, a dielectric 102, 202, 402, or an electrically conductive material of the vias 61, 62, 64. The first via 61, the second via 62 and the fourth via 64 have a circular contour parallel to the main extension plane of the semiconductor body.

Figure 5A:
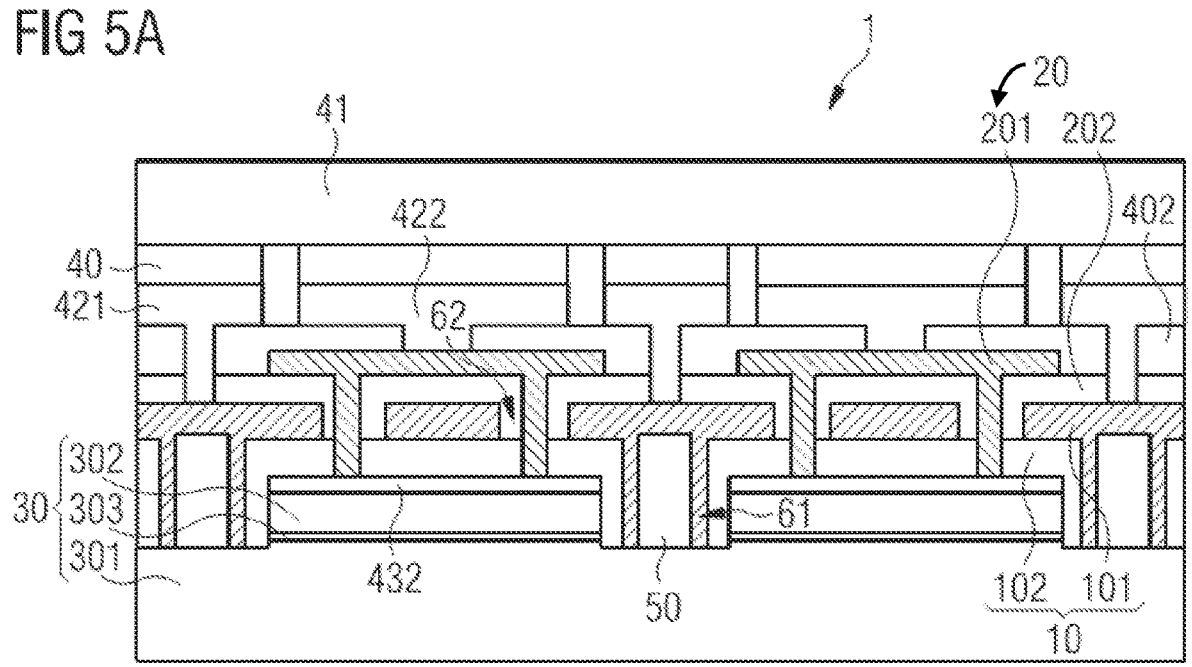

FIG. 5A shows a schematic sectional illustration of an optoelectronic semiconductor chip 1 according to a seventh example. In contrast to the structure shown in the sixth example in FIG. 4, the first via 61, that electrically conductively connects the first metallic region 101 to the n-conductive region 301, has a line-shaped or latticed contour parallel to the main extension plane of the semiconductor body.

That is, the optoelectronic semiconductor chip 1 has at least one active region 303 completely surrounded by the electrically conductive material of the first via 61 in lateral directions. Active regions 303 are completely surrounded by a first via 61 in the lateral direction, and thereby represent a single pixel of a pixelated optoelectronic semiconductor chip 1. In this case, an n-conducting region 301 is in direct contact with a plurality of pixels of the active region 303. A p-conducting region 302 is in direct physical contact with exactly one pixel of the active region 303. The individual pixels of the active regions 303 can be energized separately from the side of the p-conducting region 302 by this arrangement.

In contrast to the example shown in FIG. 4, in FIG. 5A the carrier 41 is not in direct contact with the semiconductor body 30. In particular, the carrier 41 is not a growth substrate. The seventh example has an additional solder layer 40 arranged on the side of the first 421 and second 422 contact structures facing away from the third dielectric 402. Through the solder layer 40, the first 421 and second 422 contact structures electrically conductively connect to a carrier 41. The carrier 41 may have electrical structures via which the individual pixels of the optoelectronic semiconductor chip 1 can be driven and operated.

The optoelectronic semiconductor chip 1 has on its side surfaces on the outside exposed surfaces of the first metallic layer 101. These exposed surfaces may arise during the singulation of the pixelated optoelectronic semiconductor chips 1.

Figure 5B:
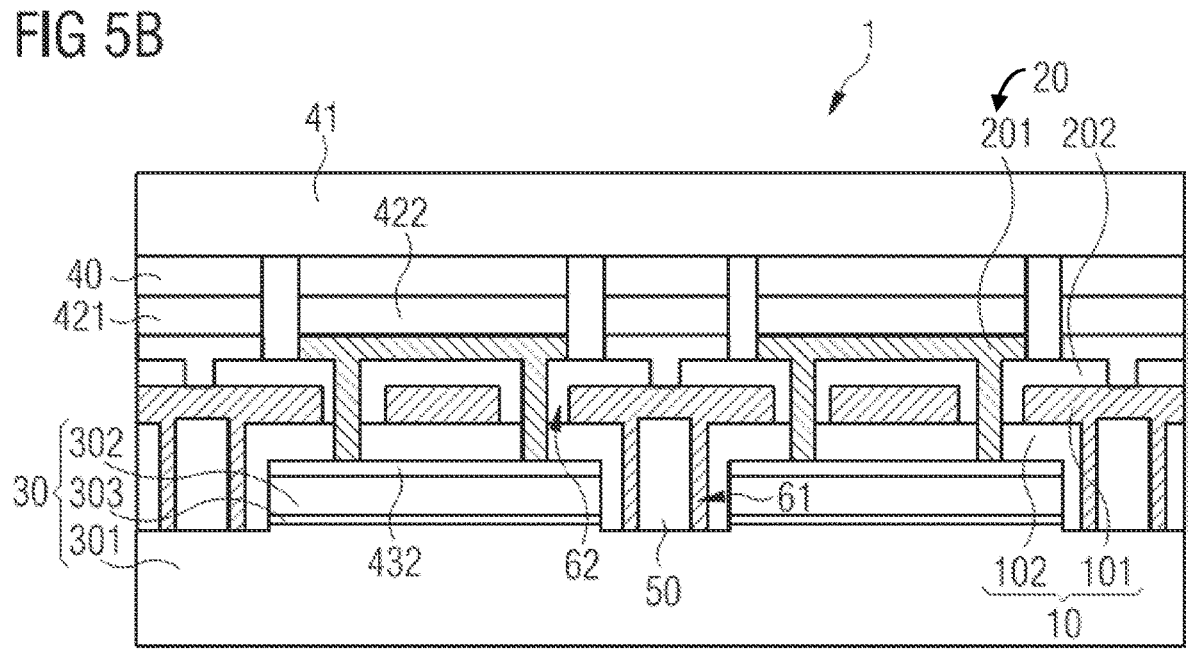

FIG. 5B shows a schematic sectional illustration of an optoelectronic semiconductor chip 1 according to an eighth example. In contrast to the seventh example shown in FIG. 5A, no third dielectric 402 is arranged on the side of the p-metallization 20 facing away from the first mirror 10. In particular, the second metallic layer in this example comprises a reflective material which is not prone to ion formation, for example, rhodium.

Directly on the side facing away from the first mirror 10 side of the second metallic layer 201 second contact structures 422 are arranged. The second contact structures 422 electrically conductively connect to the carrier 41 by a solder layer 40. On the fourth via 64 first contact structures 421 are arranged. The fourth vias 64 electrically connect the first contact structures 421 with the first metallic layer 101. In particular, the fourth via 64 is formed of the same material as the second metallic layer 201.

Figure 6:
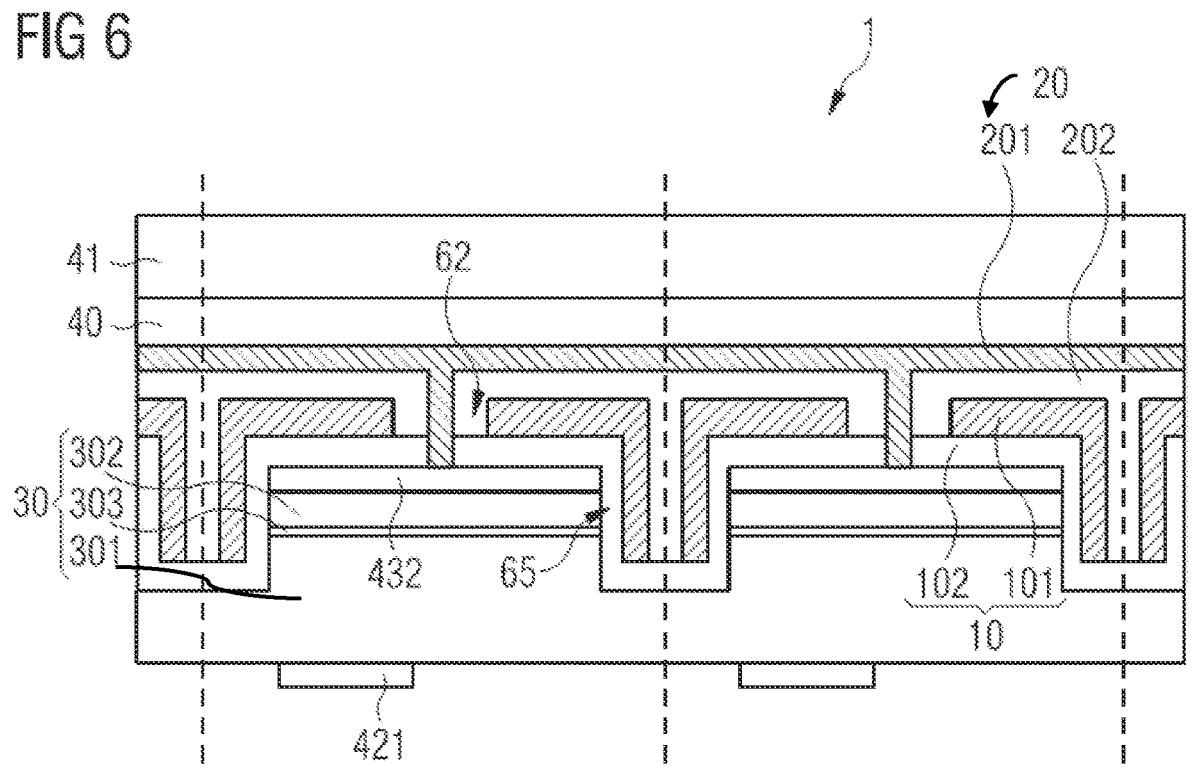

FIG. 6 shows a schematic sectional illustration of an optoelectronic semiconductor chip 1 according to a ninth example. The optoelectronic semiconductor chip 1 comprises a semiconductor body 30 formed from an n-conducting region 301, a p-conducting region 302 and an active region 303. The active region 303 is arranged, perpendicular to the main extension plane of the semiconductor body 30, between the p-conducting region 302 and the n-conducting region 301. On the side of the p-conducting region 302 facing away from the active region, a second current spreading layer 432 is arranged. The second current spreading layer 432 is in direct contact with the p-conducting region 302 and completely covers the side of the p-conducting region 302 facing away from the n-conducting region 301.

On the side of the n-conducting region 301 facing away from the p-conducting region 302, first contact structures 421 that electrically contact the n-conducting region 301 are formed. On the side of the p-conducting region 302 facing away from the n-conducting region 301, a first mirror 10 is arranged and comprises a first metallic layer 101 and a first dielectric 102. On the side facing away from the semiconductor body 30 side of the first mirror 10, a p-metallization 20 is arranged. The p-metallization 20 comprises a second metallic layer 201. In particular, the p-metallization 20 next to the second metallic layer 201 may comprise further metallic and non-metallic layers. In contact with the second metallic layer 201, a second dielectric 202 may be arranged. The second dielectric 202 completely covers the sides of the second metallic layer 201 facing the first metallic layer 101. That is, the first metallic layer 101 and the second metallic layer 201 are not in direct physical contact. All surfaces of the first metallic layer 101 that are not covered by the second dielectric 202 are covered with the first dielectric 102 and are in direct physical contact therewith.

The semiconductor body 30 has at least one recess 65 that extends obliquely, in particular perpendicularly, to the main extension plane of the semiconductor body 30 through the second current spreading layer 432 into the n-conducting region 301. In the recess, the first mirror 10 extends along the side surfaces of the second current imposition layer 432, the p-conducting region, and optionally along the side surfaces of the n-conducting region. The recess has a line-shaped or a grid-shaped contour parallel to the main extension plane of the semiconductor body. That is, the optoelectronic semiconductor chip 1 has at least one active region 303 completely surrounded by the first mirror 10 in lateral directions. The active regions 303, completely surrounded by a first via 61 in the lateral direction, thereby represent a single pixel of a pixelated optoelectronic semiconductor chip 1. The n-conducting region 301 is in direct contact with a plurality of pixels of the active region 303. The p-conducting region 302 is in direct physical contact with exactly one pixel of the active region 303. The individual pixels of the active regions 303 can be energized separately from the side of the p-conducting region 302 by this arrangement.

In the region of the recess 65, the first metallic layer 101 is completely penetrated in the vertical direction by the material of the first dielectric 102 or the material of the second dielectric 202. That is, the first metallic layer 101 surrounding a pixel of the active region 303 in lateral directions is not in direct physical contact with the region of the first metallic layer 101 that completely surrounds an adjacent pixel of the active region in lateral directions. Thus, the individual pixels of the active region 303 may be mechanically separated from each other along a linear plane without the first metallic layer 101 having outwardly exposed surfaces after separation. That is, all surfaces of the first metallic layer are covered by either the first dielectric 102 or the second dielectric 202.

Furthermore, the first mirror has a second via 62, by which the metallic layer 201 connects in an electrically conductive manner to the second current spreading layer 432. The electrically conductive connection between the second current spreading layer 432 and the second metallic layer 201 is formed from the material of the second metallic layer 201. The side surfaces of the second via 62 are completely covered or formed with the material of the first dielectric 102 and/or the second dielectric 202. The first metallic layer 101 is electrically isolated from the second metallic layer 202 in the region of the second via.

A solder layer 40 is arranged on the side facing away from the first mirror 10 side of the second metallic layer 201. The solder layer serves both as electrical contacting of the second metallic layer 201 and thus of the p-conducting region 302, as well as for the encapsulation of the second metallic layer 201 to protect it from moisture.

A carrier 41 is arranged on the side of the solder layer 40 facing away from the second metallic layer 201. The carrier serves as a mechanically stabilizing element and allows the electrical contacting of the p-conducting region. In operation, the n-conducting region 301 is electrically contacted via the first contact structures 421 and the p-conducting region 302 is electrically contacted via the carrier 41. In particular, the p-conducting regions 302 of the individual pixels can be contacted and energized separately from one another by the carrier 41.

My optoelectronic semiconductor chips are not limited by the description based on the examples. Rather, this disclosure encompasses any novel feature as well as any combination of features including in particular any combination of features in the appended claims, even if the feature or combination itself is not explicitly stated in the claims or examples.

This application claims priority of DE 102016106831.4, the subject matter of which is incorporated herein by reference.

The invention claimed is:

1. An optoelectronic semiconductor chip comprising:
   a semiconductor body comprising an n-conducting region, a p-conducting region and an active region between the n-conducting region and the p-conducting region;
   a first mirror containing a first metallic layer, and
   a p-metallization containing a second metallic layer, wherein
   during operation of the semiconductor chip, the first mirror is not at the same electrical potential as the p-conducting region,
   during operation of the semiconductor chip, the p-metallization is at the same electrical potential as the p-conducting region and the first metallic layer is at the same potential as the n-conducting region, and
   the first mirror has at least one opening through which the p-metallization is electrically conductively connected to the p-conducting region.

2. The optoelectronic semiconductor chip according to claim 1, wherein the first metallic layer contains or consists of one of: Ag (silver), Al (aluminum), Rh (rhodium) and Au (gold).

3. The optoelectronic semiconductor chip according to claim 1, wherein the surface portion of the first mirror facing the active region is greater than the surface fraction of the p-metallization facing the active region.

4. The optoelectronic semiconductor chip according to claim 1, wherein the first mirror has a reflectivity greater than a reflectivity of the p-metallization.

5. The optoelectronic semiconductor chip according to claim 1, wherein the main extension plane of the first mirror is arranged between the semiconductor body and the p-metallization.

6. The optoelectronic semiconductor chip according to claim 1, wherein the first mirror has an opening and the p-metallization is at least partially disposed in the opening of the first mirror.

7. The optoelectronic semiconductor chip according to claim 1, wherein the first metallic layer is covered with a first dielectric at sides facing the active region.

8. The optoelectronic semiconductor chip according claim 1, wherein the first mirror projects beyond the semiconductor body in lateral directions.

9. The optoelectronic semiconductor chip according to claim 1, wherein the p-metallization is at least partially formed of the same material as the first mirror.

10. The optoelectronic semiconductor chip according to claim 1, wherein the first mirror and the n-conducting region are electrically conductively connected to one another by a third via and the via completely penetrates the semiconductor body, perpendicular or transverse to the main extension plane of the semiconductor body.

11. The optoelectronic semiconductor chip according to claim 1, wherein the p-metallization has a fourth via through which a first contact structure extends, and
the first contact structure is electrically conductively connected to the first mirror.

12. The optoelectronic semiconductor chip according to claim 1, wherein the active region is completely surrounded by the first mirror in lateral directions.

13. The optoelectronic semiconductor chip according to claim 1, wherein the first metallic layer is covered on all sides with electrically insulating material.

14. The optoelectronic semiconductor chip according to claim 1, wherein the second metallic layer is free of silver.

15. An optoelectronic semiconductor chip comprising:
a semiconductor body comprising an n-conducting region, a p-conducting region and an active region between the n-conducting region and the p-conducting region;
a first mirror containing a first metallic layer, and
a p-metallization containing a second metallic layer,
wherein
during operation of the semiconductor chip, the first mirror is not at the same electrical potential as the p-conducting region,
during operation of the semiconductor chip, the p-metallization is at the same electrical potential as the p-conducting region,
the first mirror has at least one opening through which the p-metallization is electrically conductively connected to the p-conducting region,
the p-metallization is at least partially formed of the same material as the first mirror, and
the active region is completely surrounded by the first mirror in lateral directions.

16. The optoelectronic semiconductor chip according to claim 15, wherein the first metallic layer is at the same potential as the n-conducting region.

17. The optoelectronic semiconductor chip according to claim 15, wherein the p-metallization has a fourth via through which a first contact structure extends, and the first contact structure is electrically conductively connected to the first mirror.

18. An optoelectronic semiconductor chip comprising:
a semiconductor body comprising an n-conducting region,
a p-conducting region and an active region between the n-conducting region and the p-conducting region;
a first mirror containing a first metallic layer, and
a p-metallization containing a second metallic layer,
wherein
during operation of the semiconductor chip, the first mirror is not at the same electrical potential as the p-conducting region, and
the p-metallization is at the same electrical potential as the p-conducting region,
the first mirror has at least one opening through which the p-metallization is electrically conductively connected to the p-conducting region, and
the first mirror and the n-conducting region are electrically conductively connected to one another by a third via and the via completely penetrates the semiconductor body perpendicular or transverse to the main extension plane of the semiconductor body.

19. The optoelectronic semiconductor chip according to claim 18, wherein the first metallic layer is at the same potential as the n-conducting region.

20. The optoelectronic semiconductor chip according to claim 18, wherein the first metallic layer is covered on all sides with electrically insulating material.

* * * * *